United States Patent
Kim (10) Patent No.: US 10,192,631 B2
(45) Date of Patent: Jan. 29, 2019

(54) CURRENT MEMORY CIRCUIT FOR MINIMIZING CLOCK-FEEDTHROUGH

(71) Applicant: Foundation Of Research and Business, Seoul National University Of Science and Technology, Seoul (KR)

(72) Inventor: Seong-Kweon Kim, Seoul (KR)

(73) Assignee: Foundation of Research and Business, Seoul National University of Science and Technology (KR)

(*) Notice: Subject to any disclaimer, the term of this patent is extended or adjusted under 35 U.S.C. 154(b) by 0 days.

(21) Appl. No.: 15/749,653

(22) PCT Filed: Sep. 1, 2015

(86) PCT No.: PCT/KR2015/009166
§ 371 (c)(1),
(2) Date: Feb. 1, 2018

(87) PCT Pub. No.: WO2017/026569
PCT Pub. Date: Feb. 16, 2017

(65) Prior Publication Data
US 2018/0226134 A1    Aug. 9, 2018

(30) Foreign Application Priority Data
Aug. 12, 2015   (KR) .................... 10-2015-0113931

(51) Int. Cl.
*H03K 5/00*   (2006.01)
*G11C 27/02*   (2006.01)
(Continued)

(52) U.S. Cl.
CPC ............. *G11C 27/028* (2013.01); *G11C 5/10* (2013.01); *G11C 5/147* (2013.01); *G11C 7/06* (2013.01);
(Continued)

(58) Field of Classification Search
None
See application file for complete search history.

(56) References Cited

U.S. PATENT DOCUMENTS

| 7,679,420 B1* | 3/2010 | Burkland ......... H03K 19/00361 |
| | | 326/63 |
| 8,497,736 B1* | 7/2013 | Leipold ................. H03F 3/3022 |
| | | 330/267 |
| 8,749,220 B2* | 6/2014 | Hu ........................... G05F 3/30 |
| | | 323/315 |

FOREIGN PATENT DOCUMENTS

| KR | 1020010087440 A | 9/2001 |
| KR | 100364424 B1 | 12/2002 |

(Continued)

OTHER PUBLICATIONS

International Search Report; dated Jun. 29, 2016 for PCT Application No. PCT/KR2015/009166.

(Continued)

*Primary Examiner* — Long Nguyen
(74) *Attorney, Agent, or Firm* — Mendelsohn Dunleavy, P.C.

(57) ABSTRACT

The present disclosure relates to a current memory circuit for minimizing clock feedthrough, the circuit including: a first memory capacitor implemented as a first conductive type MOS; a second memory capacitor implemented as a second conductive type MOS; and a dummy capacitor for connecting the first memory capacitor and the second memory capacitor to each other, wherein the first memory capacitor and the second memory capacitor are current mirrors. Accordingly, a current memory circuit with a more accurate performance, low power consumption, and an integration capability can be provided.

11 Claims, 6 Drawing Sheets

(51) Int. Cl.
*G11C 7/06* (2006.01)
*G11C 7/10* (2006.01)
*G11C 5/10* (2006.01)
*G11C 5/14* (2006.01)
*G11C 11/56* (2006.01)
*H03F 3/45* (2006.01)

(52) U.S. Cl.
CPC .............. *G11C 7/10* (2013.01); *G11C 11/565* (2013.01); *H03F 3/45179* (2013.01)

(56) References Cited

FOREIGN PATENT DOCUMENTS

| KR | 1020040046435 A | 6/2004 |
| KR | 100699448 B1 | 3/2007 |
| KR | 1020140106037 A | 9/2014 |

OTHER PUBLICATIONS

Martins, J.M., and V.F. Dias. "Harmonic Distortion in Switched-Current Audio Memory Cells." Circuits and Systems II: Analog and Digital Signal Processing, IEEE Transactions on, vol. 46, No. 3, 1999, pp. 326-334.

\* cited by examiner

CURRENT MEMORY CIRCUIT FOR MINIMIZING CLOCK-FEEDTHROUGH

TECHNICAL FIELD

The present disclosure relates to a current memory circuit for minimizing clock feedthrough and, more particularly, to a current memory circuit configured to minimize clock feedthrough in a current memory using no bias current.

BACKGROUND ART

As supply and use of portable terminals are increasing, a high speed process is required in data treatment of portable terminals and low power consumption is regarded as important in connection with a battery life of the portable terminals. A current memory circuit using a SI (Switched-Current) circuit is attracting attention because the SI is capable of implementing high speed data treatment with low power consumption.

Figure 1:
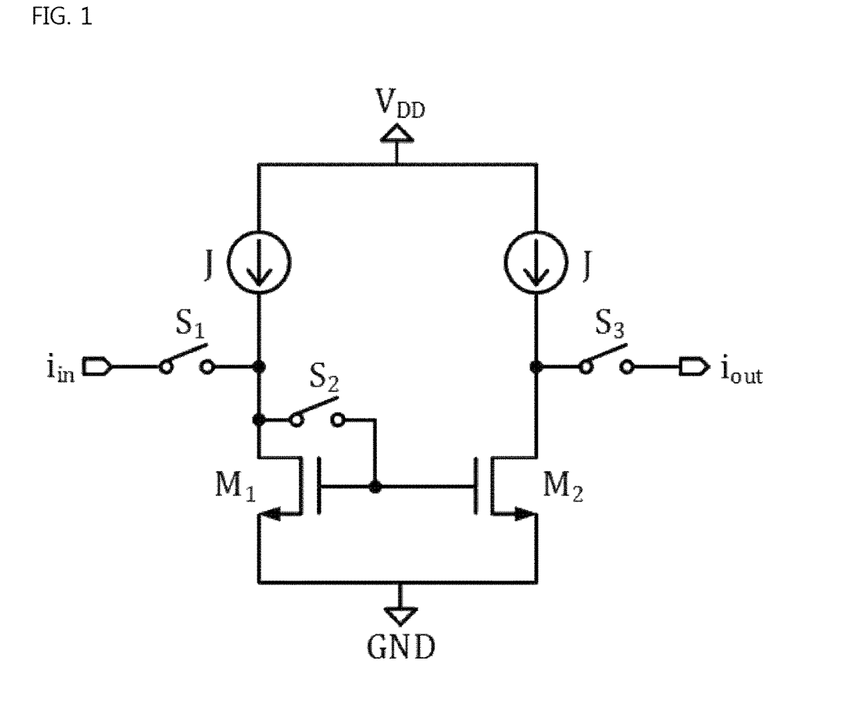
FIG. 1 is a drawing illustrating a conventional current memory circuit.

FIG. 1 is a drawing illustrating a conventional current memory circuit.

As illustrated in FIG. 1, the conventional current memory circuit uses a bias current on the basis of a current mirror. A drain current may be expressed as the sum of a bias current J and an incoming current I-in in the current mirror implemented by an N-type MOS (MOSFET) having a common gate. Therefore, the sum of the bias current J and the incoming current I-in is stored between a gate and a source of the current mirror, i.e., a memory capacitor. Accordingly, the conventional current memory circuit has a problem of high power consumption arising from a use of the bias current.

In addition, clock feedthrough occurs in the current memory circuit, wherein the clock feedthrough is a leaking of stored energy toward the direction of the switch supplying the incoming current due to nonlinear operation of a transistor and non-conformity of a process. Furthermore, in the case an error occurring due to the clock feedthrough is greater than the incoming current I-in, a problem may occur that the incoming current is entirely dissipated. That is, since the clock feedthrough decreases a voltage stored in the memory capacitor of the current memory circuit, there is a problem in the data treatment in that an error is induced in the accuracy of the stored memory and in the sustainment time of the stored memory.

DISCLOSURE

Technical Problem

The present disclosure relates to a current memory circuit minimizing power consumption without using a bias current and having improved performance by disposing a structure which can minimize clock feedthrough.

Technical Solution

The present disclosure to accomplish above objectives includes a first memory capacitor implemented as a first conductive type MOS; a second memory capacitor implemented as a second conductive type MOS; and a dummy capacitor for connecting the first memory capacitor and the second memory capacitor to each other, wherein the first memory capacitor and the second memory capacitor are current mirrors.

The present disclosure to accomplish above objectives includes a first current mirror formed by an N-type MOS; a second current mirror formed by a P-type MOS; and a dummy capacitor connecting a gate of the first current mirror and a gate of the second current mirror to each other.

Advantageous Effects

According to the present disclosure, it is possible to operate a current memory circuit with low power consumption and to realize efficient integration of the circuit since the circuit can perform signal treatment only by using an incoming current without using a bias current.

In addition, according to the present disclosure, it is possible to easily implement a circuit capable of removing the clock feedthrough occurring in the current memory circuit.

In addition, according to the present disclosure, it is possible to provide a current memory circuit capable of accurately saving a desired voltage for a long period of time, since the circuit can minimize the clock feedthrough.

Accordingly, the current memory circuit according to the present disclosure may increase accuracy, prevent malfunction, and minimize power consumption of the memory circuit.

MODE FOR INVENTION

The present disclosure related to a current memory circuit for minimizing clock feedthrough can decrease power consumption since no bias current is used in the implementation of a current mirror, and reduce errors induced by the clock feedthrough. In addition, the present disclosure describes construction of a current mirror by using MOS's different from each other, allowing each MOS to function as a capacitor, wherein a dummy capacitor is connected between two memory capacitors, thereby minimizing the clock feedthrough by mutually compensating for the clock feedthrough being leaked and forming a current memory circuit having a high degree of accuracy.

In the present disclosure, even though there is a case that a current of each element is not completely equal due to a difference of characteristics or non-conformity of elements composing the current mirror, this is limited to the extent such that overall characteristics of the current memory circuit are not affected. Accordingly, since the present disclosure accommodates an error due to the difference of characteristics or non-conformity of elements, hereinafter, a concept that currents are equal in the current mirror characteristics means not only the case current values are completely equal but also the case where an error range do not affect the overall characteristics of the current memory circuit.

Hereinafter, an exemplary embodiment according to the present disclosure will be described in detail with reference to accompanying drawings.

Figure 2:
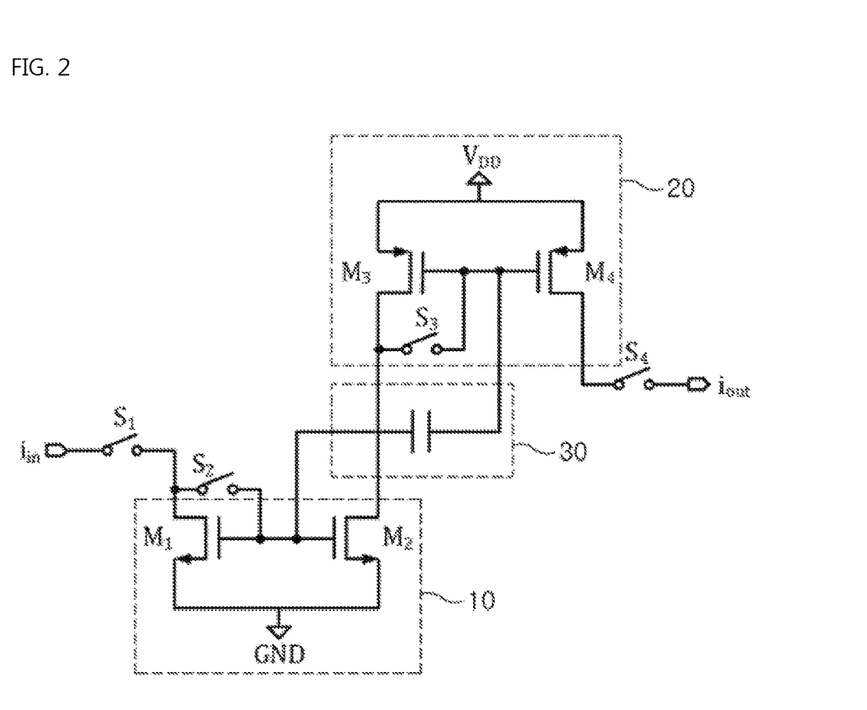
FIG. 2 is a drawing illustrating a current memory circuit according to an embodiment of the present disclosure.

FIG. 2 is a drawing illustrating a current memory circuit according to an embodiment of the present disclosure.

As illustrated in FIG. 2, a current memory circuit according to the present disclosure may include a plurality of current mirrors implemented by MOS's different from each other and implemented differently from a conventional current mirror using one type of MOS.

A first current mirror 10 is formed by using a first conductive type MOS, for example, M1 and M2 of N-type MOS. The first current mirror 10 does not use a bias current, an incoming current I-in is supplied to a drain of the M1 when a first switch S1 is turned ON. Therefore, according to the current mirror characteristics, the incoming current is equal to a drain current of the M2. A second switch S2 to short a drain and a gate of the M1 is included and sources of the M1 and the M2 are connected to a ground GND.

A second current mirror 20 is formed by using a second conductive type MOS, for example, M3 and M4 of P-type MOS. A drain of M3 and a drain of M2 are a common drain, therefore, on the current mirror characteristics, a drain current of the M2 of the first current mirror 10 is equal to a drain current of the M3, and the drain current of the M3 is equal to a drain current of the M4. Therefore, an output current I-out of the current memory circuit according to the present disclosure is the drain current of the M4 and is equal to the incoming current I-in. A third switch S3 to short a drain and a gate of the M3 and a fourth switch S4 to check the output current I-out are included, and sources of the M3 and the M4 are connected to a power source VDD.

In a state that the first switch S1, the second switch S2 and the third switch S3 are ON, a voltage is memorized in each of the MOS's. According to the present disclosure, a voltage is memorized between the gate and the source of the first current mirror 10, and a voltage is memorized between the gate and the source of the second current mirror 20. Consequentially, the first current mirror 10 and the second current mirror 20 are implemented as memory capacitors, respectively.

A dummy capacitor 30 connects the common gate of the first current mirror 10 and the common gate of the second current mirror 20 to each other. The dummy capacitor 30 may be formed in combination of individual capacitor and implemented in MOS acting as a capacitor, and includes all combinations of various elements acting as capacitors.

As described above, the current memory circuit according to the present disclosure can minimize power consumption without using the bias current and maximize spatial efficiency in making an integrated circuit. In addition, the present disclosure can compensate for the clock feedthrough being occurred between each current mirror and reduce the clock feedthrough of the current memory circuit by connecting two current mirrors using a dummy capacitor. Accordingly, a current memory with a higher degree of accuracy can be embodied according to the present disclosure.

Figure 3:
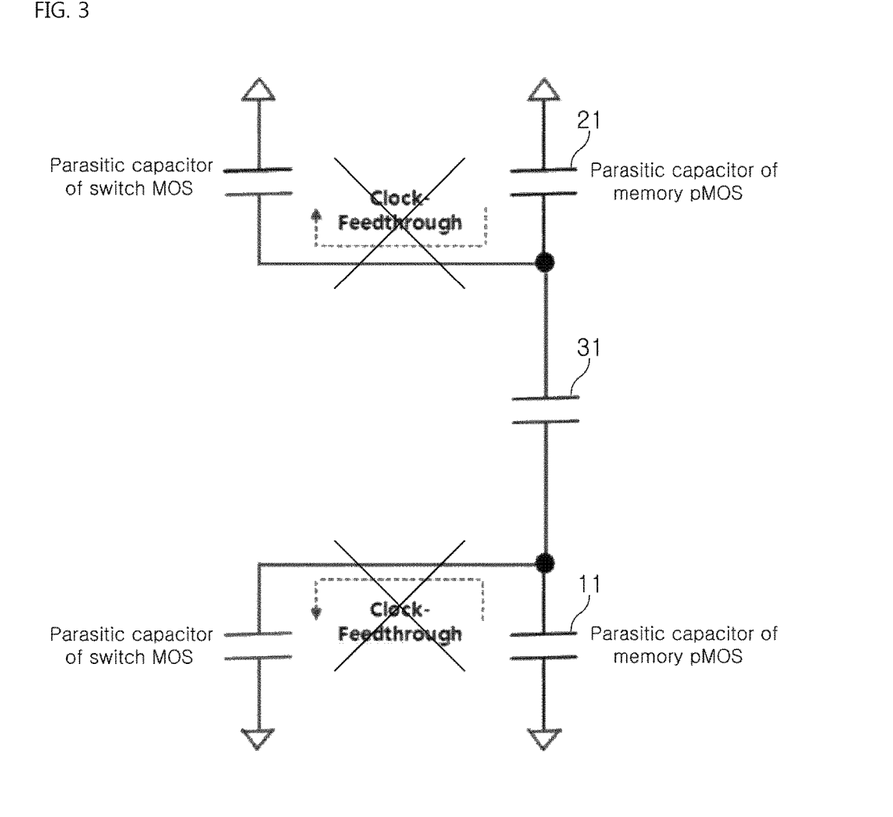
FIG. 3 is a simplified block diagram illustrating a current memory circuit according to FIG. 2.

FIG. 3 is a simplified block diagram illustrating a current memory circuit according to FIG. 2.

As illustrated in FIG. 3, the current memory circuit according to the present disclosure includes a first memory capacitor 11 formed by a current mirror of an N-type MOS and a second memory capacitor 21 formed by a current mirror of a P-type MOS. There is no limit for a type of transistor forming each memory capacitor nor as for the number of memory capacitors being embodied.

The first memory capacitor 11 and the second memory capacitor 21 are connected by a dummy capacitor 31. In the case that the dummy capacitor 31 does not exist, the clock feedthrough occurs by a parasitic capacitor induced by a switch necessary for driving the first memory capacitor 11 and a parasitic capacitor induced by a switch necessary for driving the second memory capacitor 21, whereby the clock feedthrough degrades each memory capacitor in a role as a current memory by reducing a voltage being stored in each memory capacitor.

Accordingly, the current memory circuit according to the present disclosure can disregard parasitic capacitors by connecting the dummy capacitor 31 between the first memory capacitor 11 and the second memory capacitor 21, and compensate for the clock feedthrough occurring in each of the first memory capacitor 11 and the second memory capacitor 21.

Figure 4:
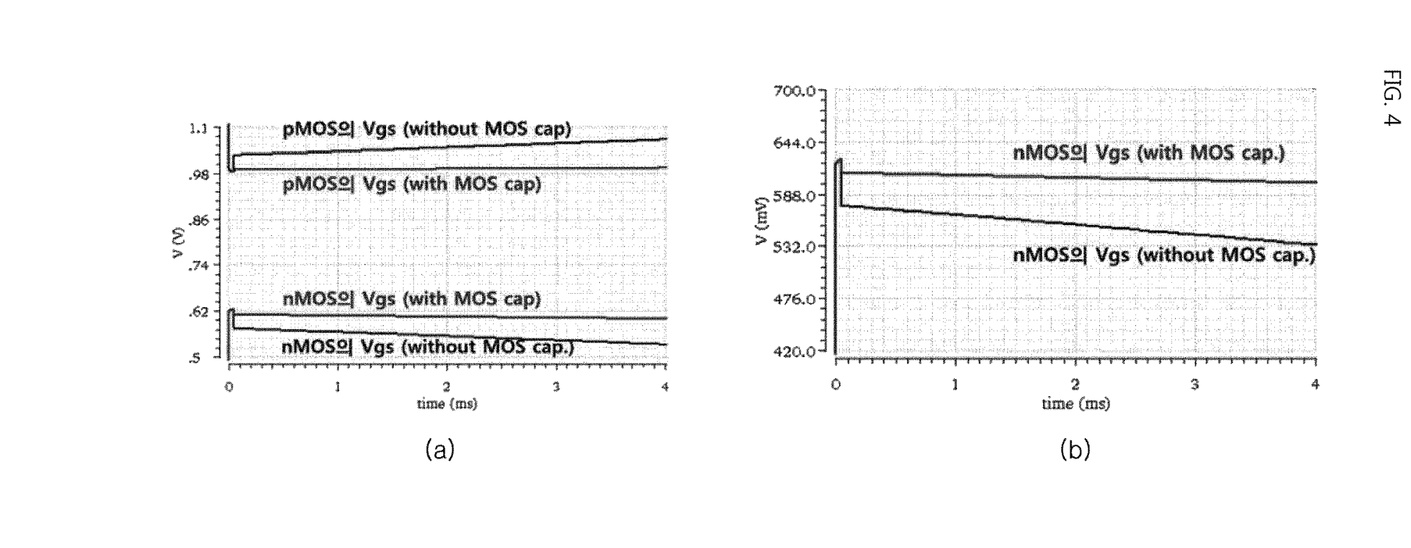
FIG. 4 shows graphs illustrating simulation results for a role of a dummy capacitor according to the present disclosure.

FIG. 4 shows graphs illustrating simulation results for a role of a dummy capacitor according to the present disclosure.

FIG. 4a is the simulation result of a voltage drop occurring at each memory capacitor in the cases that the dummy capacitor exist and does not exist, respectively, in the current memory circuit illustrated in FIG. 3.

In the case that the dummy capacitor does not exist, a voltage between a gate and a source of the current mirror embodied with the first memory capacitor, for example, N-type MOS and a voltage between a gate and a source of the current mirror embodied with the second memory capacitor, for example, P-type MOS, drop greatly while, when a dummy capacitor is connected, each of the first memory capacitor and the second memory capacitor mutually compensates for the clock feedthrough occurring in each capacitor, whereby a voltage between a gate and a source very minimally drops, as can be seen.

FIG. 4b is an enlargement of a graph illustrated in FIG. 4a and illustrates a slope of the decreasing voltage between the gate and the source of the current mirror, for example, embodied with N-type MOS. A slope of the decreasing voltage in the case without a dummy capacitor is greater than a slope of a decreasing voltage in the case with a dummy capacitor. In the case that a dummy capacitor is connected at this time, ideally, a voltage between the gate and the source of the current mirror does not decrease, whereby a slope is zero. However, in an actual simulation, a slope of the decreasing voltage greater than zero may occur due to a difference of characteristics or non-conformity of elements.

Figure 5:
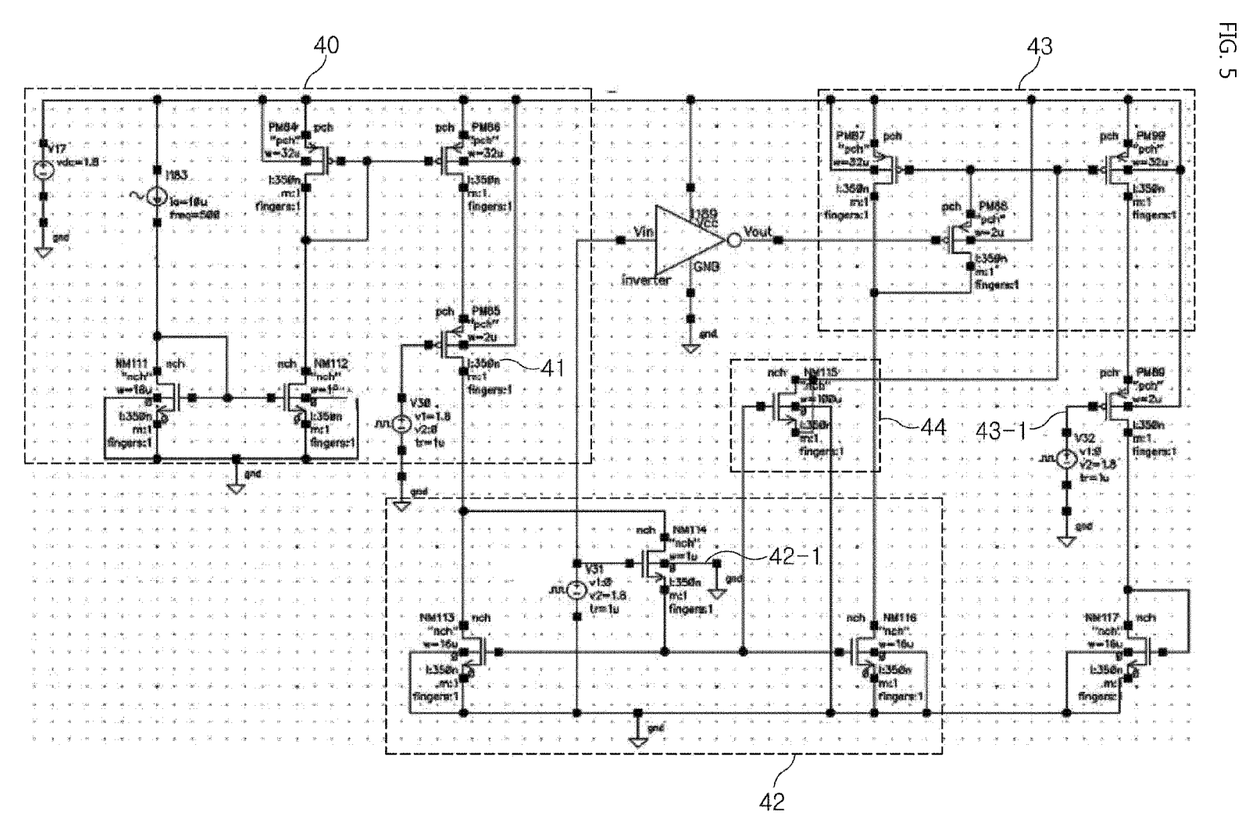
FIG. 5 is a drawing illustrating an implementation example of a current memory circuit according to an embodiment of the present disclosure.

FIG. 5 is a drawing illustrating an implementation example of a current memory circuit according to an embodiment of the present disclosure.

As illustrated in FIG. 5, the current memory according to an embodiment of the present disclosure includes an incoming current supply part 40, a first switch 41 supplying the incoming current, a first current mirror 42 implemented as a first conductive type MOS (for example, N-type MOS), a second current mirror 43 implemented as a second conductive type MOS (for example, P-type MOS), and a dummy capacitor 44 connecting a common gate of the first current mirror and a common gate of the second current mirror. The first current mirror 42 includes a second switch 42-1 to short a drain and a gate in the first current mirror 42, the second current mirror 43 includes a third switch 43-1 to short a drain and a gate in the second current mirror 43. The incoming current supply part 40 may be configured in various types of circuits supplying a current.

The present disclosure may include at least two memories and the dummy capacitor may minimize the clock feedthrough by connecting two memory capacitors implemented with MOS's different from each other.

Figure 6:
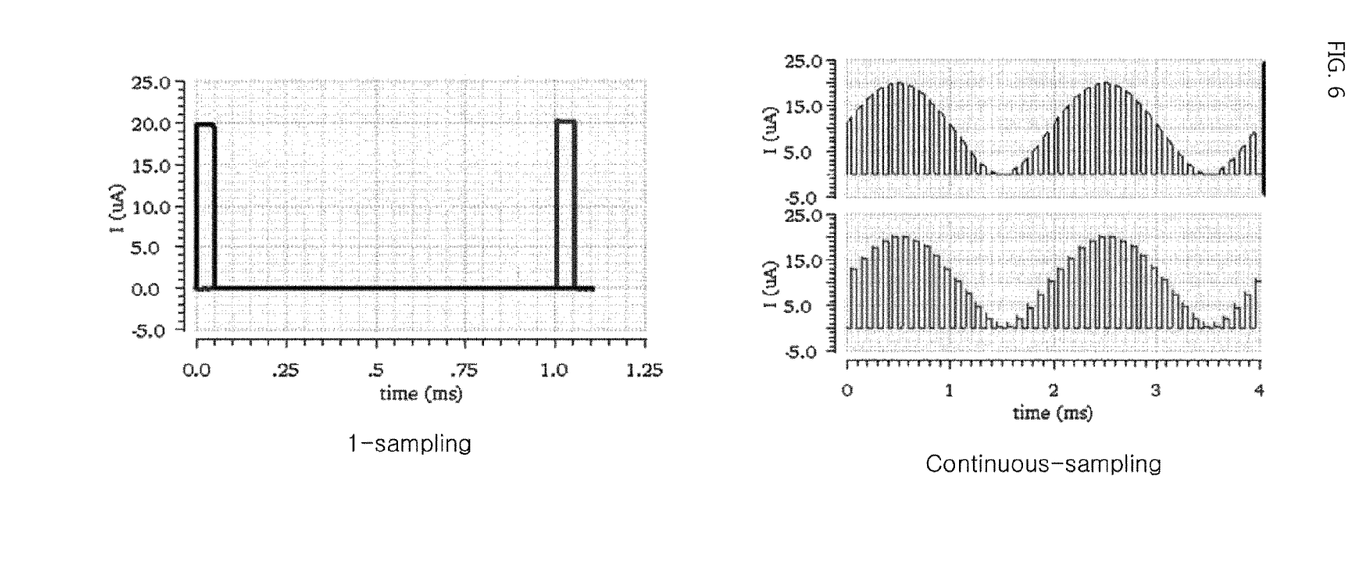
FIG. 6 shows graphs illustrating simulation results in a current memory circuit according to FIG. 5.

FIG. 6 shows graphs illustrating simulation results in a current memory circuit according to FIG. 5.

As illustrated in FIG. 6, an output current in the current memory circuit according to an embodiment of the present disclosure is illustrated identically with an incoming current, and a voltage drop or a current leakage over time are minimized, as can be seen. Sampling frequency according to the present disclosure can be designed variously, for example, from 10 kHz to 10 MHz and a range of the sampling frequency is not limited. The current memory circuit according to the present disclosure can be applied to various applications using the current memory such as ADC (Analog to Digital Converter), FIR filter (finite impulse response filter), and so on.

As described above, the current memory circuit according to the present disclosure does not use the bias current, thereby reducing power consumption and becoming spatially efficient in making an integrated circuit. In addition, the present disclosure: uses at least two memory capacitors; provides the circuit which is more easily configured and can remove the clock feedthrough; and minimizes the clock feedthrough, by disposing of the dummy capacitor between two memory capacitors. Consequentially, the present disclosure provides a current memory circuit which has more accurate performance with low power consumption and can be manufactured by integration.

The present disclosure described above is not limited to the embodiment and accompanying drawings, and those skilled in the art will appreciate that various modifications, additions and substitutions are possible, without departing from the scope and spirit of the present disclosure as disclosed in the accompanying claims. In addition, the present disclosure is not limited to the embodiment and accompanying drawings.

The invention claimed is:

1. A current memory circuit, comprising:
a first current mirror comprising:
a first input device of a first type having a gate, a drain, and a source;
a first mirrored device of the first type having a gate, a drain, and a source, wherein the gate of the first input, device is connected to the gate of the first mirrored device at a first common gate node;
a first switch connected between an input node of the current memory circuit and the drain of the first input device; and
a second switch connected between the drain and the gate of the first input device;
a second current mirror comprising:
a second input device of a second type having a gate, a drain, and a source;
a second mirrored device of the second type having a gate, a drain, and a source, wherein the gate of the second input device is connected to the gate of the second mirrored device at a second common gate node;
a third switch connected between the drain and the gate of the second input device; and
a fourth switch connected between the drain of the second mirrored device and an output node of the current memory circuit; and
a dummy capacitor connecting the first common gate node of the first current mirror and the first common gate node of the second current mirror to each other, wherein the first, second, third, and fourth switches are configurable to store a voltage in the dummy capacitor.

2. The current memory circuit of claim 1, wherein the dummy capacitor is a MOS capacitor or at least one capacitor element.

3. The current memory circuit of claim 1, wherein the first current mirror is driven only by an incoming current without using a bias current.

4. The current memory circuit of claim 3, further comprising a circuit unit supplying the incoming current.

5. The current memory circuit of claim 1, the first type is an N-type MOS and the second type is a P-type MOS.

6. The current memory circuit of claim 1, wherein the drain of the first mirrored device is connected to the drain of the second input device.

7. The current memory circuit of claim 1, wherein the first and second current mirrors are disposed to allow an incoming current of the first current mirror to be equal to an output current of the second current mirror.

8. A current memory circuit, comprising:
a first current mirror comprising:
an input N-type MOS device having a gate, a drain, and a source;
a mirrored N-type MOS device having a gate, a drain, and a source, wherein the gate of the input N-type MOS device is connected to the gate of the mirrored MOS device at a first common gate node;
a first switch connected between an input node of the current memory circuit and the drain of the input type MOS device; and
a second switch connected between the drain and the gate of the input N-type MOS device;
a second current mirror comprising:
an input P-type MOS device having a gate, a drain, and a source;
a mirrored P-type MOS device having a gate, a drain, and a source, wherein the gate of the input P-type MOS device is connected to the gate of the mirrored P-type MOS device at a second common gate node;
a third switch connected between the drain and the at of the input P-type MOS device; and
a fourth switch connected between the drain of the mirrored P-type MOS device and an output node of the current memory circuit; and
a dummy capacitor connecting the first common gate of the first current mirror and the second common gate of the second current mirror to each other, wherein the first, second, third, and fourth switches are configurable to store a voltage in the dummy capacitor.

9. The current memory circuit of claim 8, wherein the drain of the mirrored N-type MOS device of the first current mirror and the drain of the input P-type MOS device of the second current mirror are connected to each other.

10. The current memory circuit of claim 8, wherein the first current mirror is driven only by an incoming current without using a bias current.

11. The current memory circuit of claim 8, wherein the dummy capacitor is a MOS capacitor or at least one capacitor element.

* * * * *